United States Patent [19]

Niggemann

[11] Patent Number: 4,637,456
[45] Date of Patent: Jan. 20, 1987

[54] HEAT EXCHANGER

[75] Inventor: Richard E. Niggemann, Rockford, Ill.

[73] Assignee: Sundstrand Corporation, Rockford, Ill.

[21] Appl. No.: 812,841

[22] Filed: Dec. 23, 1985

[51] Int. Cl.⁴ .................. H01L 23/46; F25C 1/00
[52] U.S. Cl. .................. 165/104.33; 165/908; 165/170; 62/59; 62/340; 62/347
[58] Field of Search ........... 62/59, 347, 340, 373; 165/104.33, 908, 170

[56] References Cited

U.S. PATENT DOCUMENTS

| | | |
|---|---|---|
| 2,643,282 | 6/1953 | Greene . |
| 3,971,435 | 7/1976 | Peck . |
| 4,108,242 | 8/1978 | Searight et al. ............. 165/908 |
| 4,109,707 | 8/1978 | Wilson et al. . |
| 4,341,432 | 7/1982 | Cutchaw . |
| 4,463,409 | 7/1984 | Altoz et al. . |

FOREIGN PATENT DOCUMENTS

| | | |
|---|---|---|
| 7801075 | 8/1978 | Fed. Rep. of Germany ...... 165/908 |
| 1300251 | 6/1962 | France ............................ 62/347 |
| 10947 | 1/1977 | Japan ............................ 62/347 |

OTHER PUBLICATIONS

IBM Technical Disclosure Bulletin, vol. 23, No. 2, Jul. 1980–Discloses a Thermal Interface Augmented with Capillary Flow of Fluid.
IBM Technical Disclosure Bulletin, vol. 21, No. 6, Nov. 1978–Discloses a High Power Rectifier Jet Cooled Heat Sink.
IBM Technical Disclosure Bulletin, vol. 20, No. 9, Feb. 1978–Discloses a Liquid Jet Impinging Upon a Heated Surface for Effective Removal of Heat.
IBM Technical Disclosure Bulletin, vol. 20, No. 8, Jan. 1978–Discloses Diaphragm Cooling of Semiconductor Chips.

Primary Examiner—Albert W. Davis, Jr.
Attorney, Agent, or Firm—Wood, Dalton, Phillips, Mason & Rowe

[57] ABSTRACT

To provide a cooling arrangement utilizing liquid coolant, and capable of operating at or near the freeze point of the liquid coolant so as not to freeze solid, a steady state heat exchanger is provided. The heat exchanger includes a liquid impingement plate having a liquid carrying channel therein, a liquid supply tube for spraying liquid into the liquid carrying channel, and a liquid containment plate disposed in spaced relation to the liquid carrying channel which, together with the liquid impingement plate, defines a liquid flow chamber therebetween. Additionally, the heat exchanger includes a liquid inlet in communication with the liquid supply tube and a liquid outlet in communication with the liquid flow chamber, and utilizes a central thermal bus in heat exchange relation to the liquid impingement plate.

19 Claims, 1 Drawing Figure

U.S. Patent  Jan. 20, 1987  4,637,456
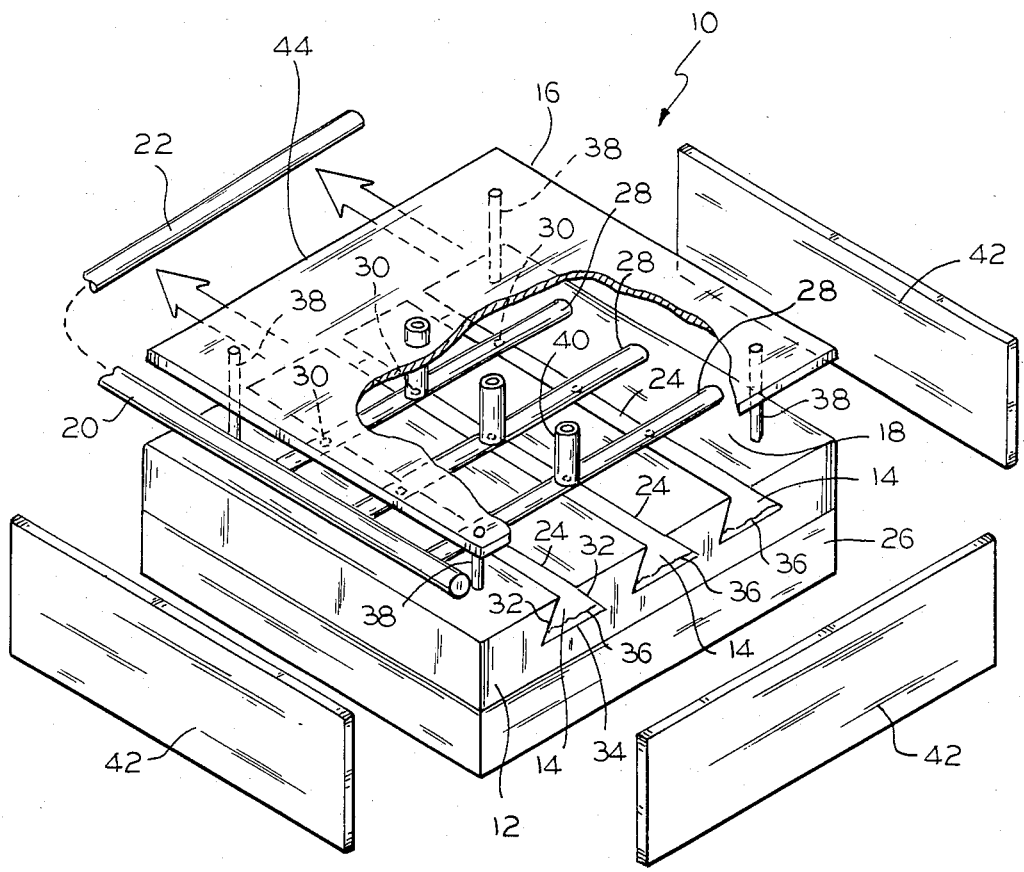

HEAT EXCHANGER

FIELD OF THE INVENTION

This invention relates in a general sense to a heat exchanger, and more specifically, to a steady state heat exchanger utilizing liquid coolant.

BACKGROUND OF THE INVENTION

Heat exchangers have been utilized successfully in a wide variety of diverse applications. Such applications range from the mundane heating and cooling requirements of the home to sophisticated applications of the types encountered in scientific experimentation, manufacturing processes, and the like. However, in most cases, it is important for a heat exchanger to operate in a controlled manner in order to be useful.

In some applications, the heat exchanger has utilized impingement spraying of a liquid coolant to maximize heat transfer while other applications channel a liquid coolant through baffles for this purpose. Nevertheless, in such applications, the heat exchanger has nearly always operated by transferring heat into a working fluid, and in some instances the working fluid was heated to the point of generating vapor or steam.

Among the heat transfer devices proposed is that disclosed in Peck U.S. Pat. No. 3,971,435. This device utilizes a series of longitudinal grooves running along the length of a base and covered by a plate having a plurality of openings registering with the grooves, and it operates such that the space outwardly of the plate serves as an evaporator region with the space between the plate and the grooves serving as a condensor region. When condensed, liquid is transported by capillary action in the grooves from the condensor region to the evaporator region of the device.

Another cooling arrangement is disclosed in IBM Technical Disclosure Bulletin, Vol. 20, No. 8 (January 1978). This is a diaphragm cooling arrangement for cooling semiconductor chips in which a coolant is sprayed against the underside of a diaphragm having contact areas for abutment with the back side of the chips which are flip-chip mounted on a ceramic substrate. With this arrangement, a jet of coolant can be directed against contact areas of the diaphragm under suitable pressure and then deflected downward into a pool of coolant.

Still another effort to provide a cooling system is disclosed in Wilson et al U.S. Pat. No. 4,109,707. This cooling system is for electronic systems and, in particular, for cooling large scale integrated circuit chips mounted on substates in which the heat exchanger has a flexible wall mounted in close proximity to a surface of the substrate to be cooled together with labyrinth passages to circulate coolant over the flexible wall to maximize heat exchange. In this manner, the uniform flow of the liquid coolant over the inner surface of the flexible wall is more closely assured.

In a particular application of interest, it is necessary to cool both lab modules and habitated modules in a space station. In this application, it is particularly desirable and an object of the invention to provide a steady state heat exchange system in which a liquid is cooled to cool, in turn, an adjacent environment in which, in the space station application, the liquid must be non-toxic and non-flammable such as water. In order to take heat out of each module, an interface contact heat exchanger can be utilized with a central thermal bus operating with ammonia at a temperature very near the freezing point of water.

With such arrangements, the design of the heat exchanger is most important because regulation of the temperature and pressure of the central thermal bus must be quite exact if localized freezing is to be avoided and damage from indefinite freeze and thaw cycles to the interface contact heat exchanger must be avoided if localized freezing is to be allowed. Additionally, the interface contact heat exchanger must not stop the flow of liquid coolant by freezing solid, should not release any ice particles interfering with return flow of liquid coolant, and must ensure the proper functioning of the cooling system's temperature control valve in spite of the freeze and thaw cycles.

The present invention is directed to overcoming the above stated problems and accomplishing the stated objects.

SUMMARY OF THE INVENTION

It is a principal object of the present invention to provide a new and improved heat exchanger having a wide range of applicability. More specifically, it is an object of the invention to provide a steady state heat exchanger utilizing liquid coolant in a closely regulated system. It is likewise an object of the invention to provide a heat exchanger that can either avoid localized freezing or tolerate localized freezing in an undamaged condition.

An exemplary embodiment of the invention achieves the foregoing objects in a heat exchanger utilizing liquid coolant. The heat exchanger includes a liquid impingement plate having a liquid carrying channel therein, means for spraying a liquid into the liquid carrying channel, and a liquid containment plate disposed in spaced relation to the liquid carrying channel which, together with the liquid impingement plate, defines a liquid flow chamber therebetween. Additionally, the heat exchanger includes liquid inlet means in communication with the liquid spraying means and liquid outlet means in communication with the liquid flow chamber, and means for cooling the liquid impingement plate on the side thereof opposite the liquid flow chamber.

With this arrangement, the liquid inlet means permits the liquid to flow through the liquid spraying means into the liquid carrying channel. It is also a feature of the exemplary embodiment for the liquid carrying channel to include means for retaining a portion of the liquid in a frozen state therewithin. Also, the liquid outlet means permits the liquid to be removed from the liquid flow chamber for recirculation to the liquid inlet means.

In a preferred embodiment, the liquid impingement plate includes a plurality of liquid carrying channels disposed to extend in longitudinally parallel relation. More specifically, the liquid carrying channels are preferably trapezoidal in transverse cross section having a narrowed channel opening facing the liquid spraying means in spaced relation to the cooling means to retain any frozen portion of the liquid in the liquid carrying channels. In addition, the liquid spraying means includes a plurality of liquid supply tubes each having a plurality of liquid spray orifices disposed over and registering with the liquid carrying channels.

With this construction, the liquid containment plate restricts the flow of liquid to the liquid flow chamber and can be disposed adjacent an environment to be cooled. Since the cooling means is disposed on the side of the liquid impingement plate opposite the liquid flow chamber, it is also disposed in remote spaced relation to the environment to be cooled and can, thus, be operated in the form of a central thermal bus utilizing ammonia with the liquid coolant within the flow chamber preferably comprising water. As will be appreciated, the central thermal bus is in heat exchange relation to the liquid impingement plate and can operate at a temperature slightly below the freezing point of the liquid coolant.

Other objects and advantages of the present invention will become apparent from the following specification taken in connection with the accompanying drawing.

DESCRIPTION OF THE DRAWING

The drawing is an exploded perspective view of a heat exchanger in accordance with the invention.

DESCRIPTION OF THE PREFERRED EMBODIMENT

An exemplary embodiment of a heat exchanger in accordance with the invention is illustrated in the drawing. The heat exchanger 10 includes a liquid impingement plate 12 having at least one and preferably a plurality of liquid carrying channels 14 therein, means for spraying a liquid into the liquid carrying channels 14 (as will be described in detail hereinafter), and a liquid containment plate 16 disposed in spaced relation to the liquid carrying channels 14 which, together with the liquid impingement plate 12, defines a liquid flow chamber 18 therebetween. In addition, the heat exchanger 10 includes liquid inlet means 20 in communication with the liquid spraying means and liquid outlet means 22 in communication with the liquid flow chamber along any edge, and means for cooling the liquid impingement plate 12 on the side thereof opposite the liquid flow chamber 18 (as will be described in detail hereinafter).

More particularly, the liquid inlet means 20 permits the liquid to flow through the liquid spraying means into the liquid carrying channels 14. After the liquid has been sprayed into the channels 14, if any portion of the liquid should undergo a phase change into a frozen state, the frozen liquid will be retained within the channels 14. However, the liquid outlet means 22 permits the unfrozen liquid to be removed from the liquid flow chamber 18 and recirculated to the liquid inlet means 20.

As shown, the liquid carrying channels 14 are disposed in the liquid impingement plate 12 to extend in longitudinally parallel relation. It will also be noted that they are preferably trapezoidal in transverse cross section to have a narrowed channel opening 24 facing the liquid spraying means in spaced relation to the cooling means or central thermal bus 26. Also, as shown, the liquid spraying means includes at least one and preferably a plurality of liquid supply tubes 28 each having at least one and preferably a plurality of liquid spray orifices 30 therein.

With this arrangement, the liquid supply tubes 28 are disposed with the liquid spray orifices 30 over the liquid carrying channels 14. It will also be seen that the liquid supply tubes are disposed over the liquid impingement plate 12 to extend in longitudinally parallel relation. In the embodiment illustrated in the drawing, the liquid supply tubes 28 are in spaced relation to extend transversely of the liquid carrying channels 14.

Additional details of the exemplary embodiment include the liquid containment plate 16 being particularly suited to be disposed adjacent an environment to be cooled. For this purpose, the liquid containment plate 16 restricts the flow of the liquid from the liquid inlet means 20 to a path defined by the liquid flow chamber 18 and then to the liquid outlet means 22, i.e., the environment to be cooled is isolated from the liquid coolant. Moreover, as shown, the central thermal bus 26 is disposed on the side of the liquid impingement plate 12 opposite the liquid flow chamber 18 in remote spaced relation to the environment to be cooled.

With this construction, the heat exchanger 10 is a steady state device. It operates such that an ice layer can be formed in the liquid carrying channels 14, e.g., when water is utilized as the liquid coolant, without the liquid flow chamber 18 being frozen solid in a manner stopping liquid flow, and without the release of any ice chunks or particles which could interfere with the return flow or the proper functioning of the cooling system's temperature control valve. While in the exemplary embodiment the liquid carrying channels 14 are generally trapezoidal in cross section, it will be appreciated that any partially closed channel configuration could be utilized.

As previously mentioned, the liquid supply tubes 28 extend transversely of the liquid carrying channels 14 with the liquid spray orifices 30 over the liquid carrying channels 14. This arrangement allows liquid from the liquid inlet means 20 to be distributed to the liquid supply tubes 28 and sprayed from the liquid spray orifices 30 through the narrowed channel openings 24 in the liquid carrying channels 14. As shown, the liquid containment plate 16 is disposed over the liquid supply tubes 28 in spaced relation to the liquid carrying channels 14 in the liquid impingement plate 12.

As will be appreciated, the narrowed channel openings 24 face the liquid spray orifices 30 in spaced relation to the central thermal bus 26. Each of the liquid carrying channels 14 is further defined by a pair of diverging side walls 32 terminating in a bottom interface surface 34 adjacent the central thermal bus 26 in generally parallel spaced relation to the narrowed channel opening 24 therein. With this arrangement, ice layers as at 36 can be allowed to form on the bottom interface surfaces 34 of the liquid carrying channels 14 without impairing the flow of liquid through the heat exchanger 10.

In the exemplary embodiment, the liquid inlet means 20 comprises a manifold extending transversely of the liquid supply tubes 28. Similarly, the liquid outlet means 22 may comprise a manifold extending parallel to the liquid supply tubes 28.

Because of the unique construction of the heat exchanger 10, the central thermal bus 26 is adapted to operate at a temperature below the freezing point of the liquid coolant, e.g., water. When the central thermal bus is ammonia cooled, and operated in this fashion, the bottom interface surfaces 34 of the liquid carrying channels 14 will similarly be cooled to a temperature at or below the freezing point of water because of the fact that the central thermal bus 26 is in intimate surface-to-surface contact with the liquid impingement plate 12. As a result, thin ice layers as at 36 will be formed on the bottom interface surfaces 34 of the liquid carrying channels 14 without risk of solid freezing in the liquid flow chamber 18 or release of ice chunks or particles from the liquid carrying channels 14.

With the arrangement described in detail, the liquid coolant is restricted to flow on the side of the liquid containment plate 16 opposite the environment to be cooled. When the environment to be cooled is either a lab module or a habitated module, and the liquid coolant is water, the potential harm to the cooled environment in the case of leakage is minimal since the liquid coolant is non-toxic and non-flammable. Moreover, since the ammonia utilized in the central thermal bus 26 is in remote spaced relation to the environment to be cooled, there should be no potential for dangerous exposure to the ammonia within the module.

Again referring to the drawing, the heat exchanger 10 preferably includes spacer means such as a plurality of posts 38 for maintaining the liquid containment plate 16 in spaced relation to the liquid impingement plate 12. It will be appreciated that the posts 38 support the liquid containment plate 16 and, in addition, at least one post 40 is provided to extend from the liquid containment plate 16 inwardly of the liquid flow chamber 18 to support each of the liquid supply tubes 28 in spaced relation to the liquid impingement plate 12. Additionally, a plurality of side panels 42 preferably enclose the liquid flow chamber 18 to restrict the flow of the liquid to the liquid flow chamber 18, in a manner that will be appreciated by those skilled in the art.

With the jet impingement flow arrangement of the present invention, the heat exchanger 10 permits operation at higher heat flux in a manner compatible with an ice layer formation that would be present at low power level, low temperature operation. The jet impingement flow arrangement is provided on the water side of the interface contact heat exchanger 10 with water being fed through the manifold 20 to the liquid supply tubes 28 which may, for example, be formed of a material such as that sold under the trademark Torlon and whose orifice pattern is aligned over and registers with the trapezoidal channels 14 in the impingement plate 12 on the top side of the interface in contact with the central thermal bus interface. After the water impinges on the plate 12, the cooled water flows to the outlet manifold 22 at the end 44 of the heat exchanger 10 using that portion of the volume between the fluid containment plate 16 and the liquid impingement plate 12, i.e., the liquid flow chamber 18.

As a result, for a low power, low temperature operation, a stable, insulating, wall bound ice layer as at 36 will be formed in each of the liquid carrying channels 14. This allows continuous liquid flow through the liquid flow chamber 18 of the heat exchanger 10 even at very low flows and low temperature operation. For instance, the heat exchanger 10 operates effectively even at a 4° C. or slightly lower set point for the central thermal bus 26.

While in the foregoing there has been set forth a preferred embodiment of the invention, it is to be understood that the invention is only to be limited by the spirit and scope of the appended claims.

I claim:

1. A heat exchanger, comprising:
   a liquid impingement plate having a liquid carrying channel therein;
   means for spraying a liquid into said liquid carrying channel;
   a liquid containment plate disposed in spaced relation to said liquid carrying channel, said liquid containment plate and said liquid impingement plate defining a liquid flow chamber therebetween;
   liquid inlet means in communication with said liquid spraying means to permit said liquid to flow through said liquid spraying means into said liquid carrying channel;
   liquid outlet means in communication with said liquid flow chamber to permit said liquid to be removed from said liquid flow chamber; and
   means for cooling said liquid impingement plate on the side thereof opposite said liquid flow chamber to a temperature at or below the freezing point of said liquid;
   said liquid carrying channel including means for retaining a portion of said liquid in a frozen state there-within, said retaining means comprising a narrowed channel opening facing said liquid spraying means in spaced relation to said cooling means.

2. The heat exchanger as defined by claim 1 wherein said liquid impingement plate includes a plurality of liquid carrying channels therein, said liquid carrying channels being disposed in said liquid impingement plate to extend in longitudinally parallel relation.

3. The heat exchanger as defined by claim 2 wherein said liquid carrying channels are trapezoidal in transverse cross section.

4. The heat exchanger as defined by claim 1 wherein said liquid spraying means includes a liquid supply tube having a liquid spray orifice therein, said liquid supply tube being disposed with said liquid spray orifice over said liquid carrying channel.

5. The heat exchanger as defined by claim 2 wherein said liquid spraying means includes a plurality of liquid supply tubes therein, said liquid supply tubes being disposed over said liquid impingement plate to extend in longitudinally parallel relation.

6. The heat exchanger as defined by claim 5 wherein each of said liquid supply tubes includes a plurality of liquid spray orifices therein, said liquid supply tubes being disposed with said liquid spray orifices over said liquid carrying channels.

7. The heat exchanger as defined by claim 1 wherein said liquid containment plate is disposed adjacent an environment to be cooled, said liquid containment plate restricting the flow of said liquid to said liquid flow chamber.

8. A steady state heat exchanger utilizing liquid coolant, comprising:
   a liquid impingement plate having a plurality of partially closed liquid carrying channels therein, said liquid carrying channels being disposed in said liquid impingement plate to extend in longitudinally parallel relation;
   a plurality of liquid supply tubes each having a plurality of liquid spray orifices therein, said liquid supply tubes being disposed over said liquid impingement plate to extend transversely of said liquid carrying channels;
   said liquid supply tubes also being disposed with said liquid spray orifices over said liquid carrying channels;
   a liquid containment plate disposed over said liquid supply tubes in spaced relation to said liquid carrying channels in said liquid impingement plate, said liquid containment plate and said liquid impingement plate defining a liquid flow chamber therebetween, said liquid containment plate being disposed adjacent an environment to be cooled and restricting the flow of said liquid to said liquid flow chamber;
   liquid inlet means in communication with said liquid supply tubes to permit said liquid to flow through said liquid supply tubes and to pass through said liquid spray orifices into said liquid carrying channels in said liquid impingement plate;

liquid outlet means in communication with said liquid flow chamber to permit said liquid to be removed from said liquid flow chamber for return to said liquid supply tubes through said liquid inlet means; and means for cooling said liquid impingement plate on the side thereof opposite said liquid flow chamber to a temperature at or below the freezing point of said liquid, said cooling means being disposed in remote spaced relation to said environment to be cooled by said steady state heat exchanger;

said liquid carrying channels having narrowed channel openings facing said liquid spray orifices in spaced relation to said cooling means.

9. The steady state heat exchanger as defined by claim 8 wherein said liquid carrying channels are trapezoidal in transverse cross section.

10. The steady state heat exchanger as defined by claim 9 wherein each of said liquid carrying channels includes a pair of diverging side walls terminating in a bottom interface surface adjacent said cooling means in generally parallel spaced relation to said narrowed channel opening therein.

11. The steady state heat exchanger as defined by claim 8 wherein said liquid inlet means includes a manifold extending transversely of said liquid supply tubes.

12. The steady state heat exchanger as defined by claim 8 wherein said cooling means is adapted to operate at a temperature at or below the freezing point of said liquid coolant.

13. The steady state heat exchanger as defined by claim 8 wherein said cooling means is a central thermal bus in heat exchange relation to said liquid impingement plate.

14. The steady state heat exchanger as defined by claim 13 wherein said liquid containment plate restricts the flow of said liquid to the side of said liquid containment plate opposite said environment to be cooled.

15. The steady state heat exchanger as defined by claim 14 wherein said liquid coolant is water and said central thermal bus is ammonia cooled.

16. The steady state heat exchanger as defined by claim 8 including spacer means for maintaining said liquid containment plate in spaced relation to said liquid impingement plate.

17. The steady state heat exchanger as defined by claim 16 wherein said spacer means includes a plurality of posts supporting said liquid containment plate in spaced relation to said liquid impingement plate.

18. The steady state heat exchanger as defined by claim 8 including at least one post extending from said liquid containment plate to support each of said liquid supply tubes in spaced relation to said liquid impingement plate.

19. The steady state heat exchanger as defined by claim 8 including a plurality of side plates enclosing said liquid flow chamber to restrict the flow of said liquid to said liquid flow chamber.

* * * * *